(12) United States Patent
Lee et al.

(10) Patent No.: US 6,537,724 B1
(45) Date of Patent: Mar. 25, 2003

(54) PHOTORESIST COMPOSITION FOR RESIST FLOW PROCESS, AND PROCESS FOR FORMING CONTACT HOLE USING THE SAME

(75) Inventors: Geun Su Lee, Kyoungki-do (KR); Jin Soo Kim, Taejon-shi (KR); Hyeong Soo Kim, Kyoungki-do (KR); Ki Ho Baik, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 108 days.

(21) Appl. No.: 09/704,265

(22) Filed: Nov. 1, 2000

(30) Foreign Application Priority Data

Dec. 10, 1999 (KR) ............................................. 99-56545
Nov. 2, 1999 (KR) ........................................... 99-48075

(51) Int. Cl.⁷ ............................................... G03F 7/004
(52) U.S. Cl. .................... 430/270.1; 430/905; 522/281; 522/334
(58) Field of Search ............................ 430/270.1, 914, 430/326; 526/281, 334

(56) References Cited

U.S. PATENT DOCUMENTS 6,136,504 A  10/2000  Tan et al.

FOREIGN PATENT DOCUMENTS

| EP | 0 793 144 A2 | 9/1997 |
| EP | 0 923 115 A1 | 6/1999 |
| WO | WO 99/57163 A1 | 11/1999 |

*Primary Examiner*—Rosemary Ashton
(74) *Attorney, Agent, or Firm*—Townsend and Townsend and Crew LLP

(57) ABSTRACT

The present invention provides photoresist resins and photoresist compositions comprising the same, which are useful in a resist flow process. The present invention also provides a process for forming a contact hole pattern using the same. In particular, the photoresist resin of the present invention comprises a mixture of polymers. Preferably, a mixture of a first copolymer and a second copolymer. In one aspect, the first and the second copolymers have different properties. Photoresist compositions of the present invention can be used to reduce or eliminate photoresist overflow during a resist flow process. In addition, photoresist compositions of the present invention allow formation of uniform sized patterns and improve standing wave effect.

18 Claims, 9 Drawing Sheets

PHOTORESIST COMPOSITION FOR RESIST FLOW PROCESS, AND PROCESS FOR FORMING CONTACT HOLE USING THE SAME

BACKGROUND OF THE INVENTION

1. Field of the Invention

The present invention relates to photoresist resins, photoresist compositions comprising the same, and processes for using the photoresist compositions. In particular, the present invention relates to photoresist resins comprising a mixture of polymers which have different properties, and methods for using the same.

2. Description of the Background Art

Resist flow processes are used in variety of industrial applications including production of semiconductor devices. Resist flow processes are often used in production of semiconductor devices to form a fine contact hole pattern. The resist flow process can be used to produce a contact hole pattern which exceeds the resolution of the exposing device. Typically, a resist flow process is used after a pattern is formed on a substrate using a photolithography process. The photolithography process generally involves an exposure process and a development process. The photolithography process forms a photoresist contact hole pattern having a maximum resolution equal to that of the exposing device. In the resist flow process, this initially formed pattern is then heated to a temperature higher than the glass transition temperature of the photoresist resin which causes the photoresist resin to flow. This flow of photoresist resin reduces the size of contact hole until a fine contact hole necessary for the integration process is obtained.

Thus, the resist flow process makes it possible to obtain contact holes smaller than the resolution of an exposing device. Unfortunately, the resist flow process can result in a sudden or excessive photoresist resin flow (i.e., "overflow") which may result in a bent or collapsed contact hole pattern profile. This problem occurs typically at a temperature higher than the glass transition temperature of the photoresist resin.

The overflow can occur due to several factors including photoresist's sensitivity to heat, imprecise temperature control, and imprecise control of the flow time. As shown in FIG. 1a, the flow rate of a photoresist composition containing a single photoresist resin increases rapidly as the temperature approaches 150° C. As a result, the resulting contact hole pattern becomes bent and shrunken as shown in FIG. 1b. Without being bound by any theory, it is believed that this is due to the difference in flowable amount of the polymer present in the upper, center and lower portions of the contact hole pattern.

Attempts to solve the overflow problem by improving the baking process, such as maintaining a uniform baking temperature and/or controlling the precise baking time, have been mostly unsuccessful.

SUMMARY OF THE INVENTION

Accordingly, it is an object of the present invention to provide photoresist resins and photoresist compositions comprising the same which are useful in a resist flow process.

Another object of the present invention is to provide a resist flow process for forming a photoresist pattern using such photoresist composition.

Still another object of the present invention is to provide a contact hole formation method employing the photoresist pattern formed by the above-described process.

DETAILED DESCRIPTION OF THE INVENTION

The present invention provides photoresist resins, photoresist compositions comprising the same, and methods for using the same. In particular, the present invention provides a photoresist composition which is capable of reducing or eliminating overflow of photoresist resin during a resist flow process, thereby preventing a contact hole pattern from being bent or destroyed.

The photoresist composition of the present invention comprises a photoresist resin, photoacid generator and organic solvent. Unlike in a typical conventional photoresist composition, the photoresist resin of the present invention comprises a mixture of polymers having different properties.

Figure 1A:
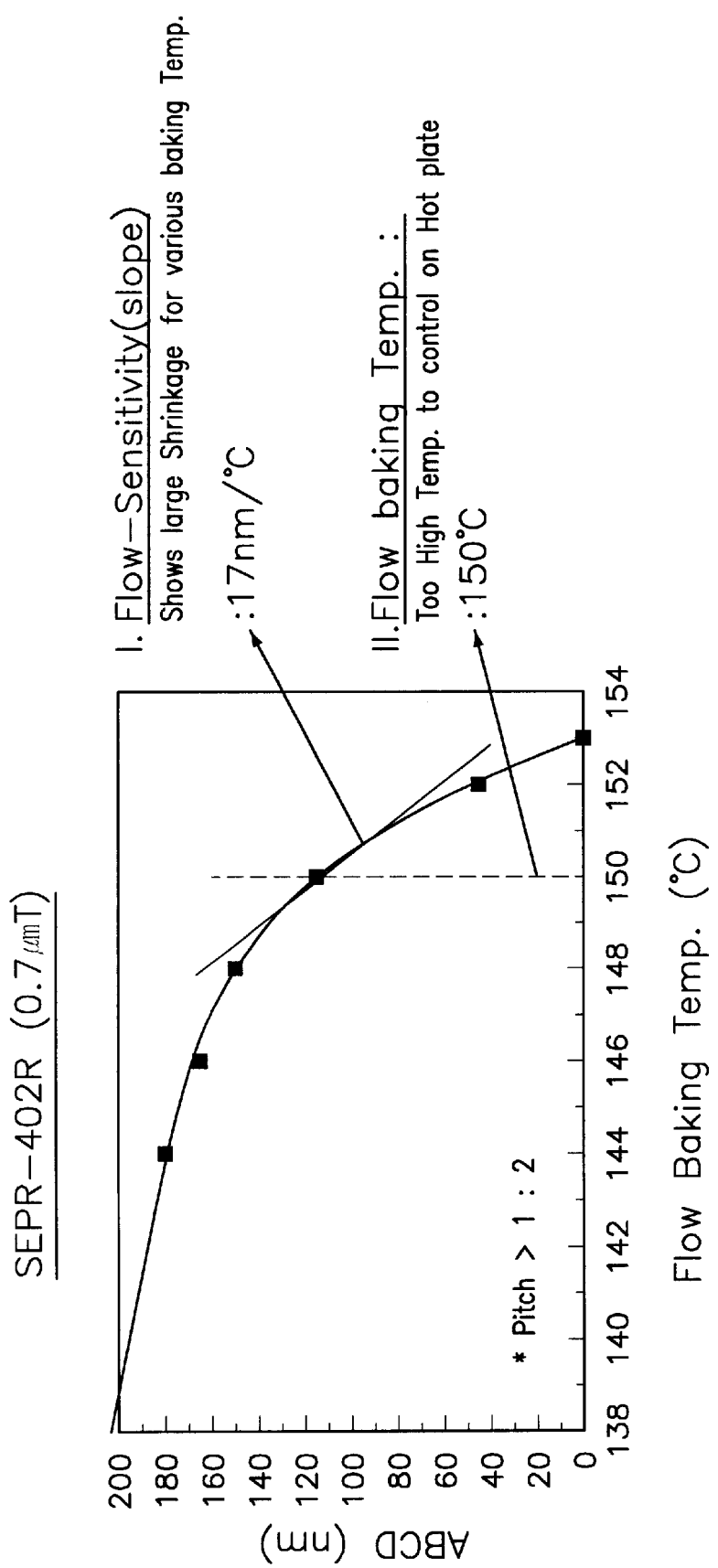
FIG. 1a is a graph of After Baking Critical Dimension (ABCD) versus the temperature of resist flow process using a conventional photoresist composition (thickness 0.7 $\mu$m).

During a resist flow process using a conventional photoresist composition comprising a single photoresist polymer, the photoresist composition flows slowly in the beginning and as the temperature increases to the glass transition temperature of the photoresist polymer the flow rate increases rapidly (see FIG. 1a). Without being bound by any theory, it is believed that the flowable amount (or the flow rate) of the polymer in the upper and lower portions is relatively smaller than in the center portion. Therefore, smaller amounts of photoresist composition flow in the upper and lower portions relative to the center portion resulting in a bent contact hole pattern (see FIG. 1b).

Photoresist resins of the present invention comprise a mixture of polymers having different properties. Preferably, photoresist resins of the present invention comprises two different polymers. Photoresist compositions comprising photoresist resins of the present invention have a gentle flow sensitivity slope as exemplified in FIG. 2. Moreover, photoresist compositions of the present invention have a slow flow rate during the resist flow process, thereby providing wider margins of process parameters.

Preferably, each polymer of the photoresist resin of the present invention has a different flow characteristic. Thus, by varying the ratio of the polymers one can adjust the flow characteristics to reduce or prevent contact hole pattern deformation. Surprisingly and unexpectedly, present inventors have found that a photoresist resin having good photoresist properties (e.g., improved flowability) can be produced by mixing different polymers. Without being bound by any theory, it is believed that these good photoresist properties are results of the difference(s) in the glass transition temperature($T_g$) of the polymers, crosslinkage between the different polymers, and/or crosslinkage within the polymer itself.

In one aspect of the present invention, the photoresist resin comprises a first copolymer and a second copolymer. The first copolymer is derived from a monomer comprising an acetal group. The second copolymer is derived from a monomer comprising an environmentally stable chemically amplified photoresist (ESCAP) polymer. Preferably, the ESCAP polymer comprises an acid-labile protecting group.

In one embodiment of the present invention, the first copolymer is derived from a monomer comprising a compound of the formula:

(1a) [styrene with –O–CH(CH₃)–O–CH₂–$R_2$ acetal substituent at para position]

(1b) [bicyclic/norbornene structure with ($ )_y$ bridge, bearing R' and –O–CH(CH₃)–O–CH₂–$R_2$ acetal group]

or mixtures thereof;
and the second copolymer is derived from a monomer comprising a compound of the formula:

(2a) $H_2C=C(R_8)-C(=O)-O-R_{17}$

-continued (2b) [bicyclic/norbornene structure with ($ )_x$ bridge, bearing R and –C(=O)–O–$R_{17}$]

or mixtures thereof;
where $R_2$ is H, or optionally substituted linear or branched ($C_1$–$C_{10}$) alkyl or aryl; $R_8$ is H or alkyl, and preferably H or methyl; $R_{17}$ is an acid labile protecting group; R and R' are independently optionally substituted linear or branched ($C_0$–$C_{10}$) alkylene; and x and y are independently integers of 1 or 2.

The first copolymer monomer can further comprise a compound of the formula:

(3) [4-hydroxystyrene: $H_2C=CH$–phenyl–OH]

(4) [$H_2C=C(R_7)$–phenyl–$R_{16}$]

and mixtures thereof;
where $R_7$ is H or alkyl, preferably H or methyl; and $R_{16}$ is H, or optionally substituted linear or branched ($C_1$–$C_{10}$) alkyl or aryl.

Additionally, or alternatively, the first copolymer monomer can further comprise a cross-linking compound of the formula:

(5) [$H_2C=C(R_1)-C(=O)-O-C(R_3)(R_4)-[C(R_5)(R_6)]_n-C(R_3)(R_4)-O-C(=O)-C(R_1)=CH_2$]

where $R_1$ is H or alkyl, preferably H, or methyl; $R_3$, $R_4$, $R_5$ and $R_6$ are independently H, or optionally substituted linear or branched ($C_1$–$C_{10}$) alkyl or aryl; and n is an integer from 1 to 5.

The second copolymer monomer can further comprise a compound of the formula:

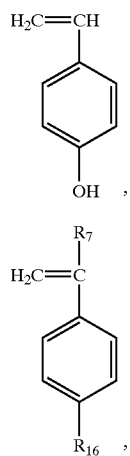

and mixtures thereof;
where $R_7$ is H or alkyl, preferably H or methyl; and $R_{16}$ is H, or optionally substituted linear or branched ($C_1$–$C_{10}$) alkyl or aryl.

Additionally, or alternaively, the second copolymer monomer can further include a cross-linking compound of the formula:

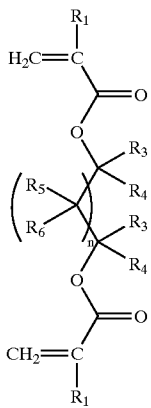

where $R_1$ is H or alkyl, preferably H, or methyl; $R_3$, $R_4$, $R_5$ and $R_6$ are independently H, or optionally substituted linear or branched ($C_1$–$C_{10}$) alkyl or aryl; and n is an integer from 1 to 5.

Preferred first copolymers include polymers of the formula:

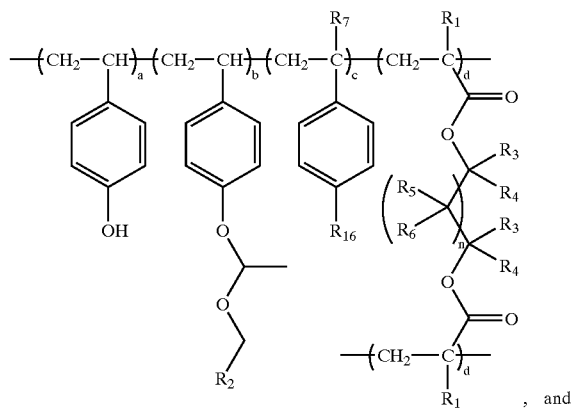

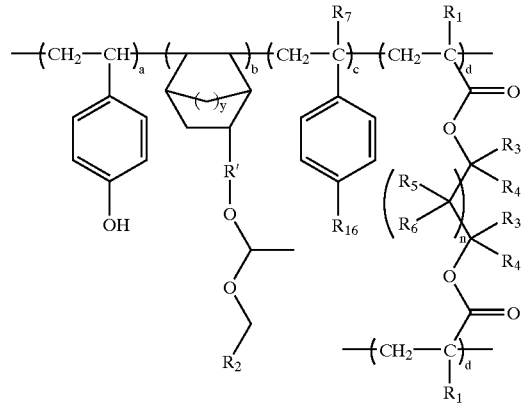

where R', $R_1$, $R_2$, $R_3$, $R_4$, $R_5$, $R_6$, $R_7$, $R_{16}$, y and n are those defined above; and the ratio of a:b:c:d is 20–70 mol %:10–70 mol %:0–50 mol %:0–20 mol %. Throughout this application, for a polymer derived from a monomer comprising a diacrylate derivative, it should be appreciated that the "bottom" portion of the diacrylate (e.g., as shown in Compounds 6 and 7 above) can be polymerized with any other monomers as well as another diacrylate compound. Dicarylate compound is cross-linking compound as described above, thus polymers of the present invention derived from a monomer comprising a diacrylate derivative can be a network polymer.

The terminal groups of polymers depicted in the present disclosure depend on the polymerization initiator used. In addition, as used throughout this disclosure, it should be appreciated that the order of monomeric units represented in polymer formulas of the present disclosure does not necessarily indicate the actual order of such monomeric units in the polymers. Monomeric units represented in polymer formulas are intended to simply indicate the presence of such monomeric units in the polymer. Moreover, the variables represent the total relative ratio of each units. For example, the total amount "a" in Formula 6 above can be inter dispersed throughout the polymer (not necessarily in same concentrations) or all or majority of such polymeric unit can be concentrated in one particular location of the polymer.

Preferred second copolymers include polymers of the formula:

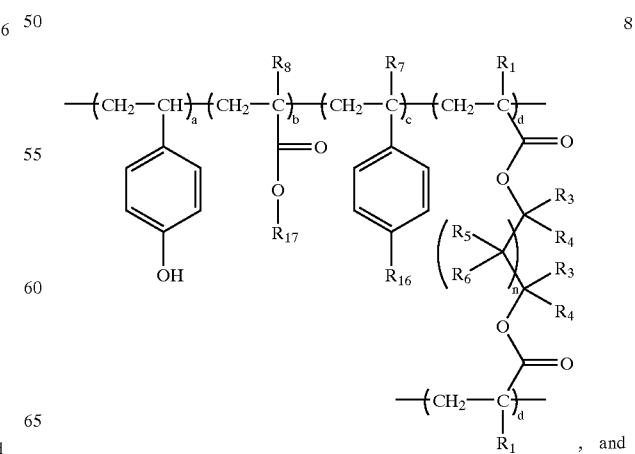

, and

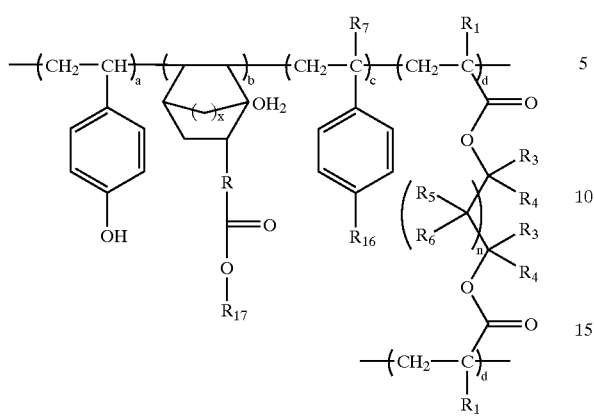

where R, $R_1$, $R_3$, $R_4$, $R_5$, $R_6$, $R_7$, $R_8$, $R_{17}$, x, and n are those defined above; and the ratio of a:b:c:d is 20–70 mol %:10–70 mol %:0–50 mol %:0–20 mol %.

Preferably, the ratio between the first copolymer and the second copolymer is 1–99% by weight:99–1% by weight.

Preferably, the acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-tert-butoxyethyl, 1-isobutoxyethyl and 2-acetylmenth-1-yl.

Exemplary first copolymers include, but are not limited to, the following copolymers:

Poly[4-hydroxystyrene/4-(1-ethoxy)ethoxy styrene/styrene/neopentylglycoldiacrylate]:

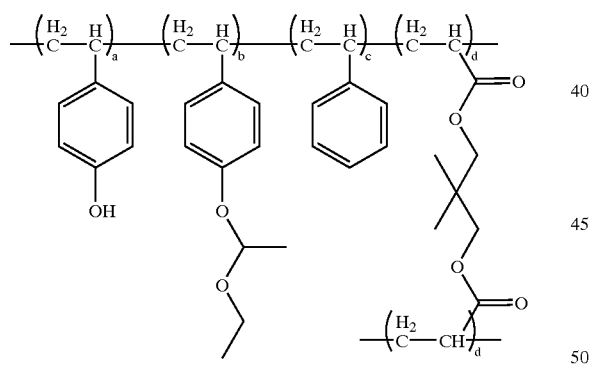

Poly[4-hydroxystyrene/4-(1-ethoxy)ethoxy styrene/styrene];

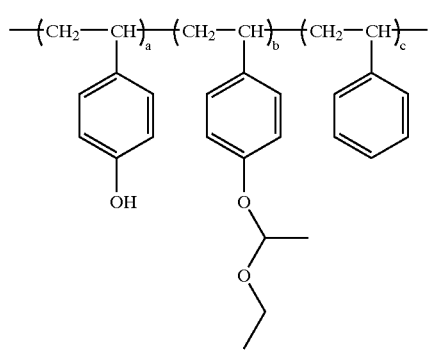

Poly[4-hydroxystyrene/4-(1-benzyloxy)ethoxy styrene/styrene]:

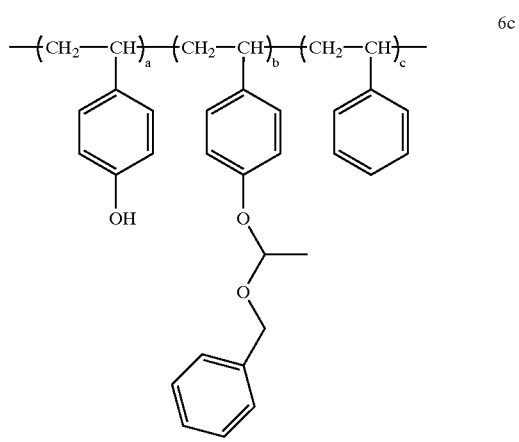

Exemplary second copolymers include, but are not limited to, the following copolymers:

Poly(4-hydroxystyrene/tert-butylacrylate/styrene/neopentylglycoldiacrylate):

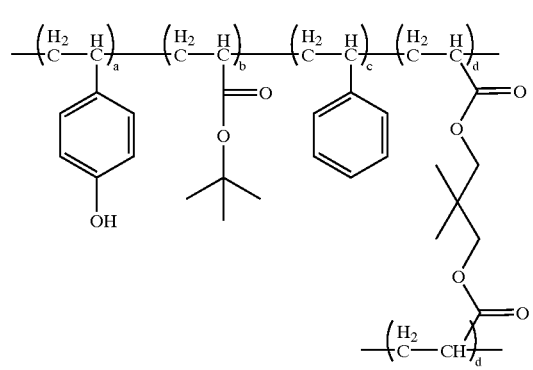

Poly(4-hydroxystyrene/tert-butylacrylate/styrene/2,4-dimethyl-2,4-pentanedioldiacrylate):

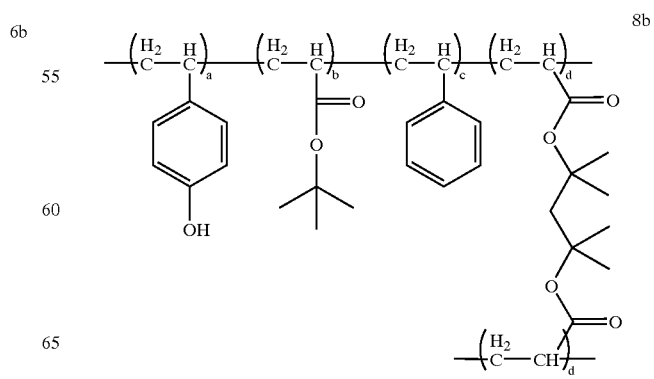

Poly(4-hydroxystyrene/tert-butylacrylate/styrene):

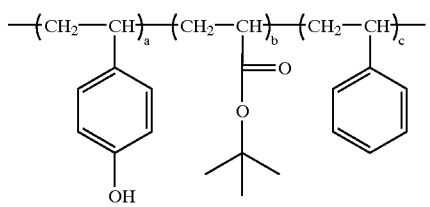

8c

The photoacid generator and organic solvent for the conventional photoresist composition can be used in photoresist compositions of the present invention.

Preferred photoacid generators include sulfide and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof The photoacid generator is used in an amount of 0.01 to 10 wt % of the photoresist resin employed.

While a variety of organic solvents are suitable for use in the photoresist composition of the present invention, the organic solvent selected from the group consisting of propylene glycol methyl ether acetate, ethyl lactate, methyl 3-methoxypropionate, ethyl 3-ethoxypropionate and cyclohexanone is preferred. The amount of solvent used is preferably in the range of from about 100% to about 1000% by weight of the photoresist resin.

Another aspect of the present invention provides a process for producing a photoresist pattern comprising the steps of:
(a) coating the above described photoresist composition on a substrate to form a photoresist film;
(b) forming a first photoresist pattern using a lithography process (preferably the first photoresist pattern has a lower resolution than the maximum resolution of an exposing device); and
(c) producing a second photoresist pattern from the first photoresist pattern using a resist flow (i.e., flow bake) process.

Preferably, the second photoresist pattern has a higher resolution than the first photoresist pattern. More preferably, the second photoresist pattern has a higher resolution than the maxium resolution of the exposing device of the step (b).

The temperature of the resist flow process of step (c) is typically in the range of from about 120 to about 190° C., preferably from about 140 to about 170° C.

Figure 4A:
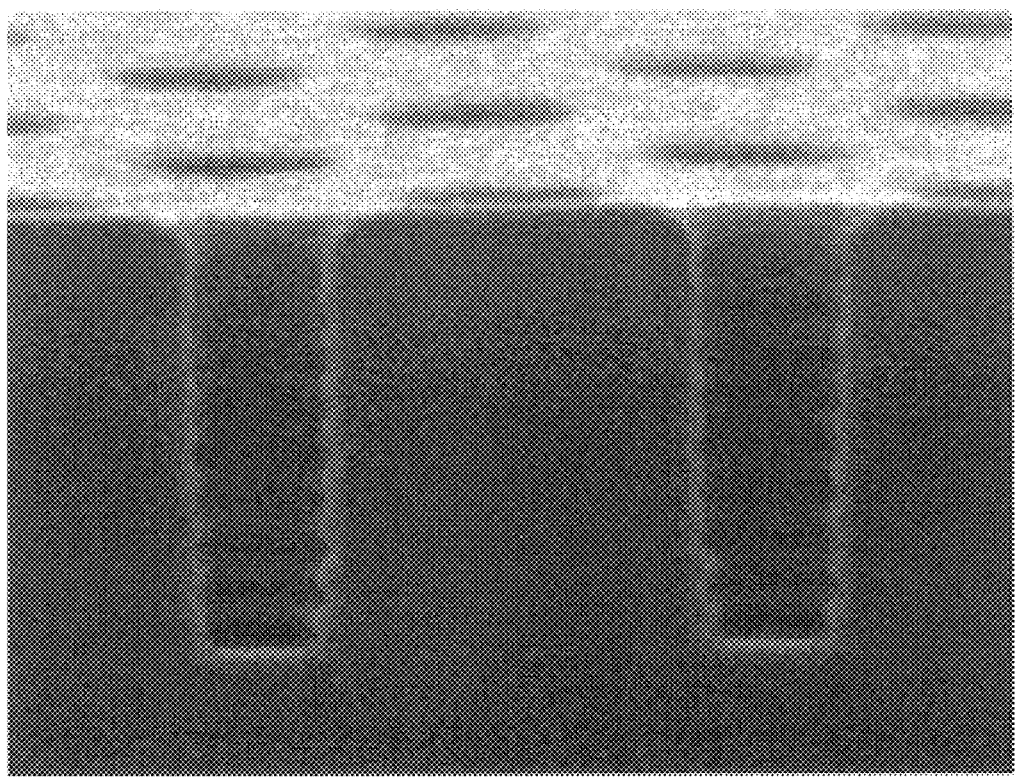
FIG. 4a shows a photoresist pattern before the resist flow process using a conventional photoresist composition.
Figure 4B:
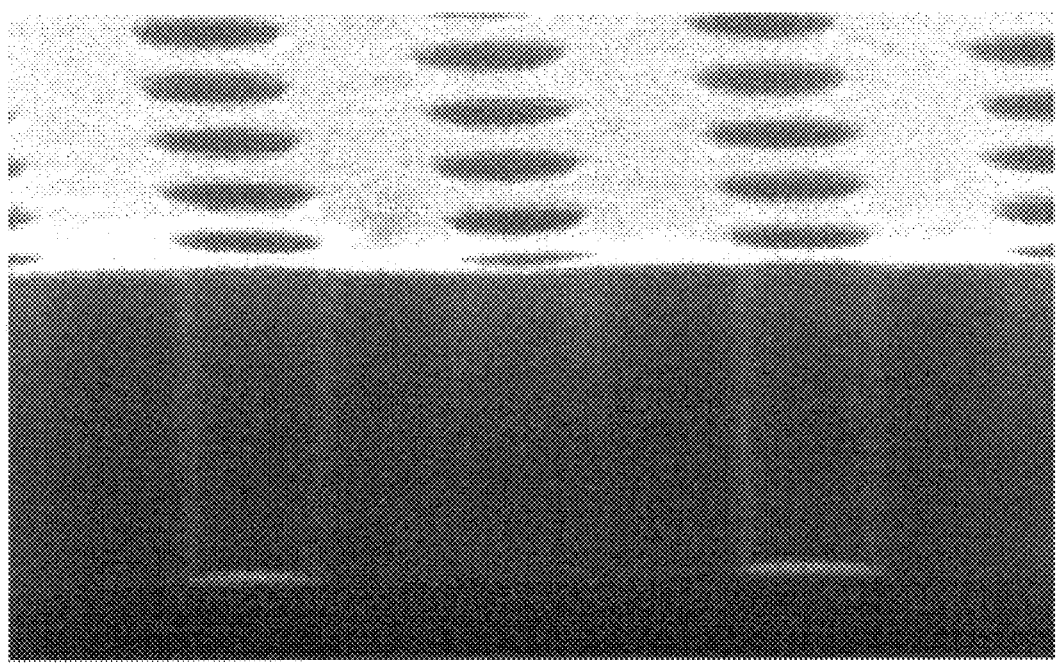
FIG. 4b shows a photoresist pattern before the resist flow process using a photoresist composition of the present invention.

As illustrated in FIGS. 4a and 4b, photoresist compositions of the present invention also improves a standing wave effect in the first photoresist pattern.

Still another aspect of the present invention provides a method for preparing a contact hole using the photoresist composition described above. In particular, a substrate coated with the photoresist composition of the present invention is etched using the second photoresist pattern (as described above) as an etching mask to form the contact hole.

Yet another embodiment of the present invention provides a semiconductor element that is manufactured using the photoresist composition described above.

The present invention will now be described in more detail by referring to the examples below, which are not intended to be limiting.

I. Synthesis of Photoresist Polymer

Example 1

Synthesis of poly[4-hydroxystyrene/4-(1-ethoxy) ethoxy styrene/styrene/neopentvlglycoldiacrylate]

To 20 mL of anhydrous dimethylformamide was added 0.055 mole of 4-hydroxystyrene, 0.03 mole of 4-(1-ethoxy) ethoxy styrene, 0.01 mole of styrene, 0.005 mole of neopentylglycoldiacrylate and AIBN. The mixture was stirred at 100° C. under an Ar atmosphere (below 0.1 torr). The resulting polymer was precipitated in methanol, filtered and dried to yield the title polymer of Formula 6a (yield: 38%).

Example 2

Synthesis of poly[4-hydroxystyrene/4-(1-ethoxy) ethoxy styrene/styrene]

To 20 mL of anhydrous dimethylformamide was added 0.055 mole of 4-hydroxystyrene, 0.03 mole of 4-(1-ethoxy) ethoxy styrene, 0.01 mole of styrene and AIBN. The mixture was stirred at 100° C. under an Ar atmosphere (below 0.1 torr). The resulting polymer was precipitated in methanol, filtered and dried to yield the title polymer of Formula 6b (yield: 38%).

Example 3

Synthesis of poly[4-hydroxystyrene/4-(1-benzyloxy) ethoxy styrene/strene]

To 20 mL of anhydrous dimethylformamide was added 0.055 mole of 4-hydroxystyrene, 0.03 mole of 4-(1-benzyloxy)ethoxy styrene, 0.01 mole of styrene and AIBN. The mixture was stirred at 100° C. under an Ar atmosphere (below 0.1 torr). The resulting polymer was precipitated in methanol, filtered and dried to yield the title polymer of Formula 6c (yield: 38%).

Example 4

Synthesis of poly(4-hydroxystyrene/tert-butylacrylate/strene/neopentylglycoldiacrylate)

To 20 mL of anhydrous dimethylformamide was added 0.055 mole of 4-hydroxystyrene, 0.03 mole of tert-butylacrylate, 0.01 mole of styrene, 0.005 mole of neopentylglycoldiacrylate and AIBN. The mixture was stirred at 100° C. under an Ar atmosphere (below 0.1 torr). The resulting polymer was precipitated in methanol, filtered and dried to yield the title polymer of Formula 8a (yield: 37%).

Example 5

Synthesis of poly(4-hydroxystyrene/tert-butylacrylate/styrene/2,4-dimethyl-2,4-pentanedioldiacrylate)

To 20 mL of anhydrous dimethylformamide was added 0.055 mole of 4-hydroxystyrene, 0.03 mole of tert-butylacrylate, 0.01 mole of styrene, 0.005 mole of 2,4-dimethyl-2,4-pentanedioldiacrylate and AIBN. The mixture was stirred at 100° C. under an Ar atmosphere (below 0.1 torr). The resulting polymer was precipitated in methanol, filtered and dried to yield the title polymer of Formnula 8b (yield 39%).

Example 6

Synthesis of poly(4-hydroxystyrene/tert-butylacrylate/styrene)

To 20 mL of anhydrous dimethylformamide was added 0.055 mole of 4-hydroxystyrene, 0.03 mole of tert-butylacrylate, 0.01 mole of styrene and AIBN. The mixture was stirred at 100° C. under an Ar atmosphere (below 0.1 torr). The resulting polymer was precipitated in methanol, filtered and dried to yield the title polymer of Formula 8c (yield 39%).

II. Preparation of Photoresist Composition and Formation of Pattern

Example 7

The polymer obtained using the procedure of Example 1 (5 g) and the polymer obtained using the procedure of Example 4 (5 g) were added to 40 g of methyl 3-methoxypropionate. To this mixture was added triphenylsulfonium triflate or dibutyl naphthylsulfonium triflate (0.01 to 1 g). The mixture was then stirred and filtered through a 0.10 µm filter.

The filtered photoresist composition was coated on a wafer, baked at 110° C. for 90 seconds and exposed to light using a 0.06NA KrF exposing device (Nikon S201). The photoresist composition was post-baked at 130° C. for 90 seconds and developed in 2.38 wt % aqueous TMAH solution to obtain a 200 nm L/S pattern. The resulting pattern was flow baked at 160° C. for 90 seconds to obtain a 80 nm L/S pattern (see FIG. 2b).

Example 8

The polymer obtained using the procedure of Example 1 (5 g) and the polymer obtained using the procedure of Example 5 (5 g) were added to 40 g of methyl 3-methoxypropionate. To this mixture was added triphenylsulfonium triflate or dibutyl naphthylsulfonium triflate (0.01 to 1 g). The mixture was stirred and filtered through a 0.10 µm filter.

The filtered photoresist composition was coated on a wafer, baked at 110° C. for 90 seconds and exposed to light using a 0.06NA KrF exposing device (Nikon S201). The photoresist composition was post-baked at 130° C. for 90 seconds and developed in 2.38 wt % aqueous TMAH solution to obtain a 200 nm L/S pattern. The resulting pattern was flow baked at 160° C. for 90 seconds to obtain a 50 nm L/S pattern (see FIG. 2c).

Example 9

The polymer obtained using the procedure of Example 1 (5 g) and the polymer obtained using the procedure of Example 6 (5 g) were added to 40 g of methyl 3-methoxypropionate. To this mixture was added triphenylsulfonium triflate or dibutyl naphthylsulfonium triflate (0.01 to 1 g). The mixture was stirred and filtered through a 0.10 µm filter.

The filtered photoresist composition was coated on a wafer, baked at 110° C. for 90 seconds, and exposed to light using a 0.06NA KrF exposing device (Nikon S201). The photoresist composition was post-baked at 130° C. for 90 seconds, and developed in 2.38 wt % aqueous TMAH solution to obtain a 235 nm L/S pattern. The resulting pattern was flow baked at 162° C. for 90 seconds to obtain a 80 nm L/S pattern, and flow baked again at 164° C. for 90 seconds to obtain a 55 nm L/S pattern (see FIG. 2d).

Comparative Example

A photoresist resin SEPR 402R KrF P/R (available from Shin-Etsu) was coated on a wafer, baked at 100° C. for 90 seconds and exposed to light using a 0.60NA KrF exposing device (Nikon S201). The photoresist composition was post-baked at 130° C. for 90 seconds, and developed in 2.38 wt % aqueous TMAH solution to obtain a 200 nm L/S pattern. The resulting wafer was flow baked at 148° C. for 90 seconds to obtain 120 nm L/S pattern, which has bent profile and not fine relatively to the patterns obtained in Invention Examples (see FIG. 1b).

Example 10

Measurement of Flow Sensitivity

Figure 3:
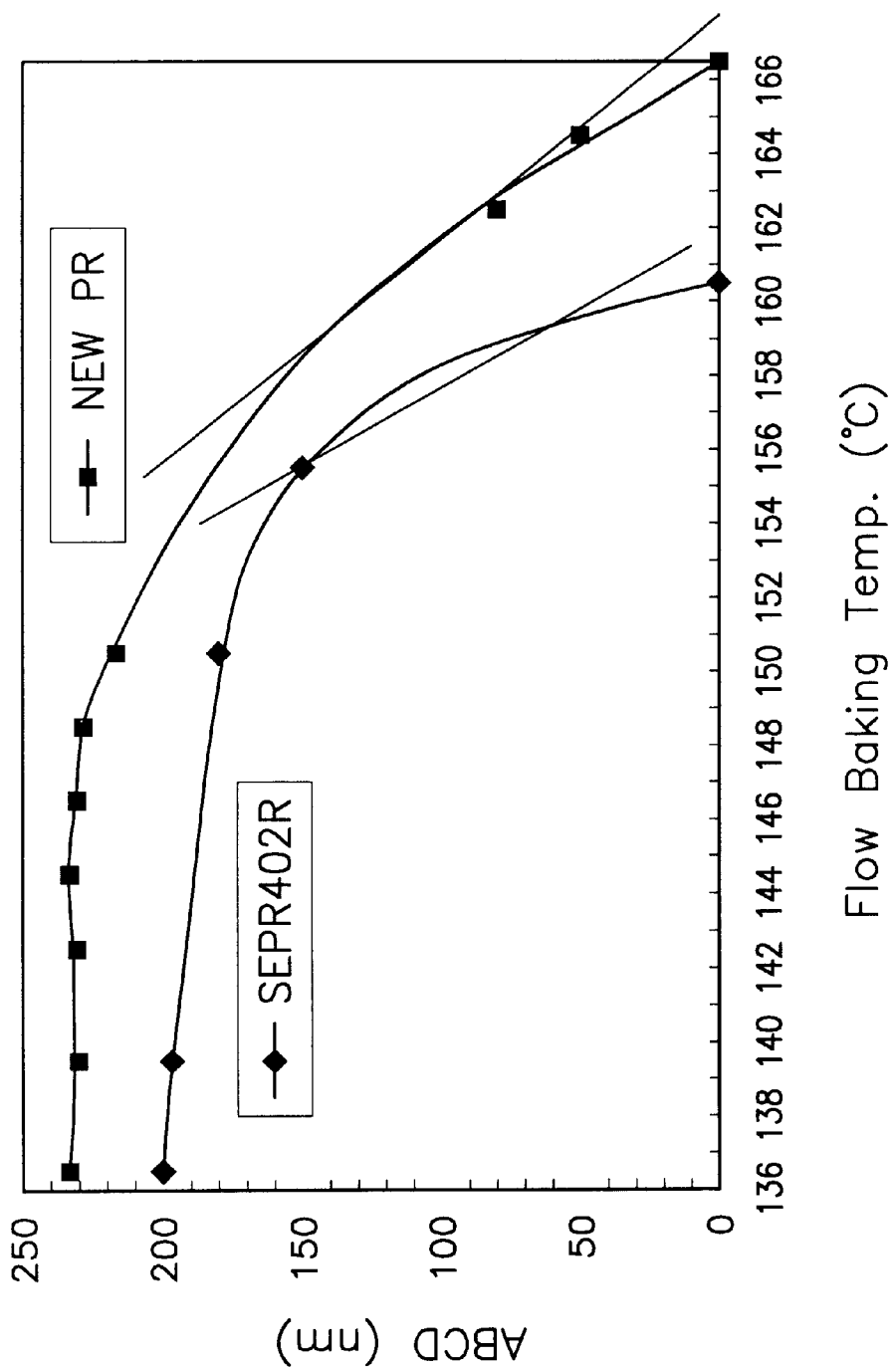
FIG. 3 is a graph of ABCD versus the temperature of resist flow process showing comparison between a photoresist composition of the present invention and a conventional photoresist composition.

FIG. 3 shows a difference in flow sensitivity when the flow bake process was performed using the photoresist composition of Example 8 and SEPR 402R (available from Shiniest) comprising a single photoresist polymer.

The flow sensitivity of the present photoresist composition is 11 nm/° C. (at temperature in the range of from about 159° C. to about 164° C.), while the flow sensitivity of SEPR 402R is 17 nm/° C. (at temperature in the range of from about 155° C. to about 160° C.). Since the photoresist composition of the present invention has a more gentle flow sensitivity, photoresist compositions of the present invention provides improved process margins compared with SEPR 402R.

Example 11

Experiment of Standing Wave Effect

The pattern obtained before resist flow process using the photoresist composition of Example 8 was compared with the pattern obtained using SEPR 402R. As shown in FIGS. 4a and 4b, there was no standing wave effect when the present photoresist was used. Thus, a good pattern can be obtained even before the resist flow process.

Photoresist compositions of the present invention reduce or eliminate overflow during a resist flow process. Therefore, a contact hole pattern having a higher resolution (i.e., smaller in size) than the resolution of an exposing device can be formed using photoresist compositions of the present invention. Furthermore, unlike conventional photoresist compositions which produce various contact hole sizes during resist flow process, photoresist compositions of the present invention allow formation of a uniformly sized contact holes below 100 nm. Moreover, use of photoresist compositions of the present invention also reduces or eliminates standing wave effect.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist composition comprising a photoresist resin, a photoacid generator and an organic solvent, wherein said photoresist resin comprises:

(a) a first copolymer derived from a first copolymer monomer comprising a compound of the formula:

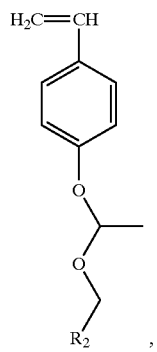

1a

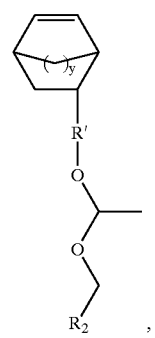

1b or mixtures thereof, and (b) a second copolymer derived from a second copolymer monomer comprising a compound of the formula:

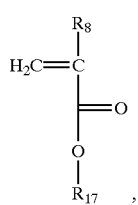

2a

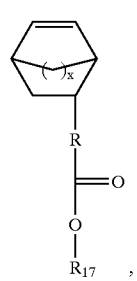

2b or mixtures thereof
wherein at least one of said first or second copolymer monomer further comprises a cross-linking monomer of the formula:

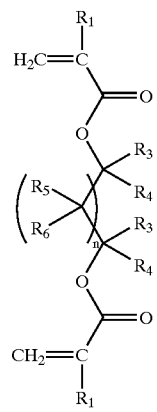

5 wherein
each $R_2$ is independently H, or optionally substituted linear or branched ($C_1$–$C_{10}$) alkyl or aryl;
$R_8$ is H or methyl;
$R_{17}$ is an acid labile protecting group;
R and R' are independently optionally substituted linear or branched ($C_0$–$C_{10}$) alkylene;
x and y are independently 1 or 2;
$R_1$ is H or alkyl;
$R_3$, $R_4$, $R_5$ and $R_6$ are independently H, or optionally substituted or linear or branched ($C_1$–$C_{10}$) alkyl or aryl; and
n is an integer from 1 to 5.

2. The photoresist composition according to claim 1, wherein said first copolymer monomer further comprises a compound of the formula:

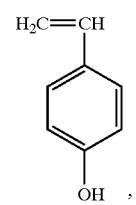

3

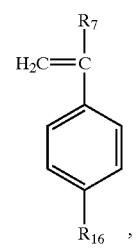

4 or mixtures thereof
wherein
$R_7$ is H or alkyl; and
$R_{16}$ is H, or optionally substituted linear or branched ($C_1$–$C_{10}$) alkyl or aryl.

3. The photoresist composition according to claim 1, wherein said second copolymer monomer further comprises a compound of the formula:

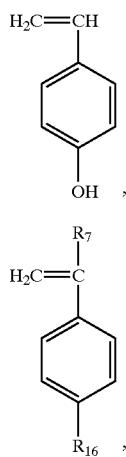

or mixtures thereof
wherein
$R_7$ is H or alkyl; and
$R_{16}$ is H, or optionally substituted linear or branched ($C_1$–$C_{10}$) alkyl or aryl.

4. The photoresist composition according to claim 1, wherein said first copolymer is of the formula:

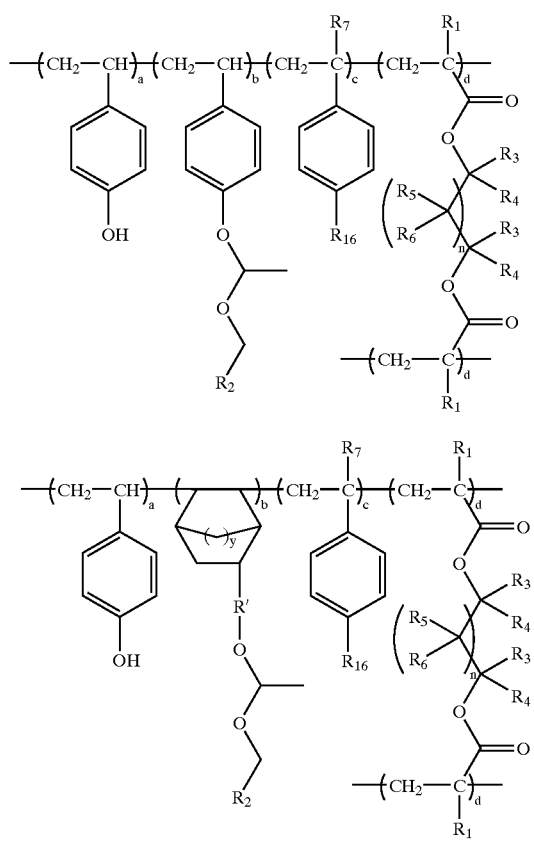

wherein
each of $R_1$ and $R_7$ is independently H or alkyl;
each of $R_2$, $R_3$, $R_4$, $R_5$, $R_6$ and $R_{16}$ is independently H, or optionally substituted linear or branched ($C_1$–$C_{10}$) alkyl or aryl;

each R' is optionally substituted linear or branched ($C_1$–$C_{10}$) alkylene; y is 1 or 2;
n is an integer from 1 to 5; and
the ratio of a:b:c:d is 20–70 mol %: 10–70 mol %:0–50 mol %:0–20 mol %.

5. The photoresist composition according to claim 1, wherein said second copolymer is of the formula:

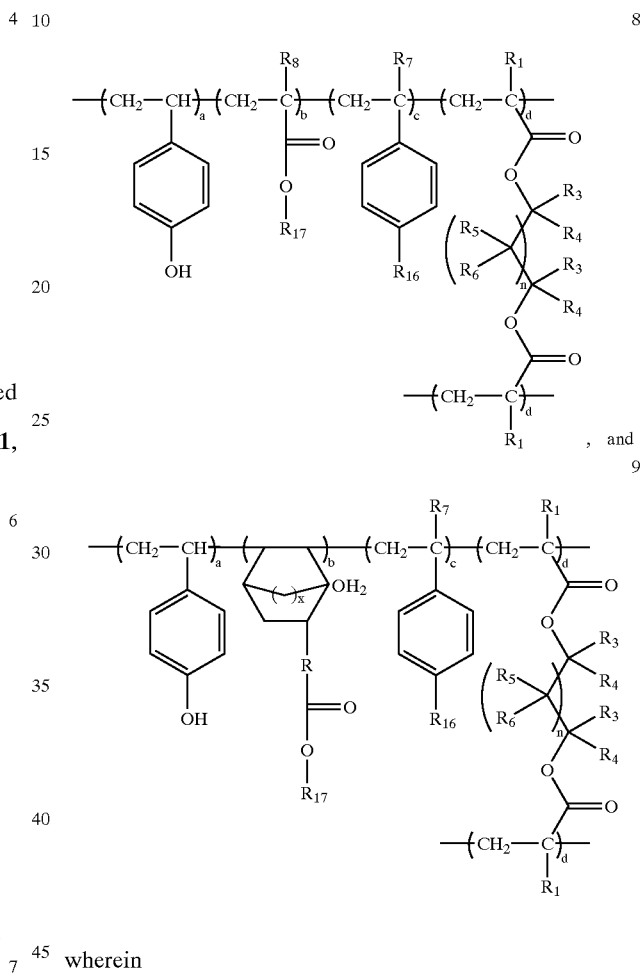

wherein
each of $R_1$, $R_7$ and $R_8$ is independently H or alkyl;
each of $R_3$, $R_4$, $R_5$, $R_6$ and $R_{16}$ is independently H, or optionally substituted linear or branched ($C_1$–$C_{10}$) alkyl or aryl;
$R_{17}$ is an acid labile protecting group;
each R is independently an optionally substituted linear or branched ($C_1$–$C_{10}$) alkylene;
x is 1 or 2;
n is an integer from 1 to 5; and
the ratio of a:b:c:d is 20–70 mol %:10–70 mol %:0–50 mol %:0–20 mol %.

6. The photoresist composition according to claim 1, wherein said acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, 1-tert-butoxyethyl, 1-isobutoxyethyl and 2-acetylmenth-1-yl.

7. The photoresist composition according to claim 1, wherein said first copolymer is selected from the group consisting of poly[4-hydroxystyrene/4-(1-ethoxy)ethoxy styrene/styrene/neopentylglycoldiacrylate]; poly[4-hydroxystyrene/4-(1-ethoxy)ethoxy styrene/styrene]; and poly[4-hydroxystyrene/4-(1-benzyloxy)ethoxy styrene/styrene].

8. The photoresist composition according to claim 1, wherein said second copolymer is selected from the group consisting of poly(4-hydroxystyrene/tert-butylacrylate/styrene/neopentylglycoldiacrylate); poly(4-hydroxystyrene/tert-butylacrylate/styrene/2,4-dimethyl-2,4-pentanedioldiacrylate); and poly(4-hydroxystyrene/tert-butylacrylate/styrene).

9. The photoresist composition according to claim 1, wherein the ratio of said first copolymer to said second copolymer is 1–99% by weight:99–1% by weight.

10. The photoresist composition according to claim 1, wherein said photoacid generator is selected from the group consisting of diphenyl iodide hexafluorophosphate, diphenyl iodide hexafluoroarsenate, diphenyl iodide hexafluoroantimonate, triphenylsulfonium hexafluororphosphate, triphenylsulfonium hexafluoroarsenate, triphenylsulfonium hexafluoroantimonate, triphenylsulfonium triflate, dibutyl-naphthylsulfonium triflate, and mixtures thereof.

11. The photoresist composition according to claim 1, wherein the amount of said photoacid generator is from about 0.01 to about 10% by weight of said photoresist resin.

12. The photoresist composition according to claim 1, wherein said organic solvent is selected from the group consisting of propylene glycol methyl ether acetate, propylene glycol methyl ether, ethyl lactate, methyl 3-methoxypropionate, ethyl 3-ethoxypropionate and cyclohexanone.

13. The photoresist composition according to claim 1, wherein the amount of said organic solvent is from about 100 to about 1000% by weight of said photoresist resin.

14. A process for forming a photoresist pattern comprising the steps of:
(a) forming a first photoresist pattern on a substrate using a photoresist composition comprising a photoresist resin, a photoacid generator and an organic solvent, wherein said photoresist resin comprises:
(i) a first copolymer derived from a first copolymer monomer comprising a compound of the formula:

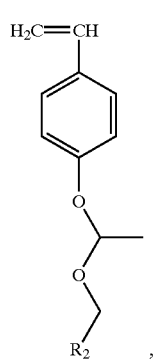
1a

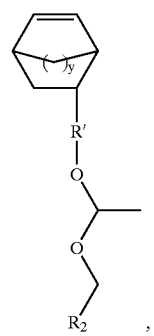
1b or mixtures thereof, and
(ii) a second copolymer derived from a second copolymer monomer comprising a compound of the formula:

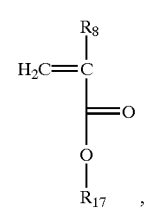
2a

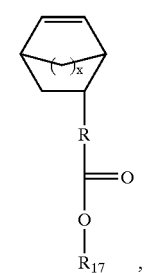
2b or mixtures thereof
wherein
each $R_2$ is independently H, or optionally substituted linear or branched $(C_1$–$C_{10})$ alkyl or aryl;
$R_8$ is H or methyl;
$R_{17}$ is an acid labile protecting group;
R and R' are independently optionally substituted linear or branched $(C_1$–$C_{10})$ alkylene; and
x and y are independently 1 or 2, and (b) producing a second photoresist pattern from said first photoresist pattern using a resist flow process.

15. The process of claim 14, wherein said step of forming first photoresist pattern comprises the steps of:
(i) coating said photoresist composition on said substrate to form a photoresist film, wherein said substrate is a semiconductor device; and
(ii) producing said first photoresist pattern using a lithography process.

16. The process according to claim 14, wherein said resist flow process comprises heating said first photoresist pattern to temperature in the range of from about 120 to about 190° C.

17. The process according to claim 14, wherein said first and second photoresist pattern comprises a contact hole pattern.

18. A photoresist resin comprising:
(a) a first copolymer derived from a first copolymer monomer comprising a compound of the formula:

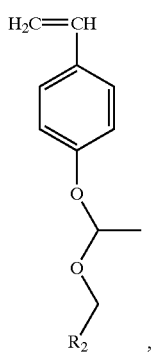

1a

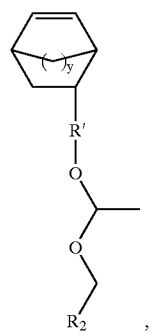

1b or mixtures thereof; and (b) a second copolymer derived from a second copolymer monomer comprising a compound of the formula:

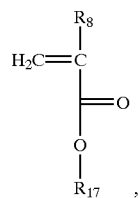

2a

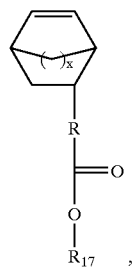

2b or mixtures thereof
wherein at least one of said first or second copolymer monomer further comprises a cross-linking monomer of the formula:

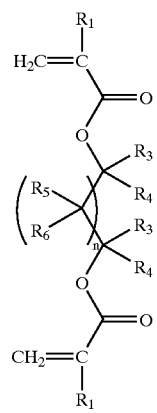

5 wherein
each $R_2$ is independently H, or optionally substituted linear or branched ($C_1$–$C_{10}$) alkyl or aryl;
$R_8$ is H or methyl;
$R_{17}$ is an acid labile protecting group;
R and R' are independently optionally substituted linear or branched ($C_0$–$C_{10}$) alkylene;
x and y are independently 1 or 2;
$R_1$ is H or alkyl;
$R_3$, $R_4$, $R_5$ and $R_6$ are independently H, or optionally substituted or linear or branched ($C_1$–$C_{10}$) alkyl or aryl; and
n is an integer from 1 to 5.

* * * * *

UNITED STATES PATENT AND TRADEMARK OFFICE
CERTIFICATE OF CORRECTION

PATENT NO. : 6,537,724 B1
DATED : March 25, 2003
INVENTOR(S) : Geun Su Lee et al.

Figure 1B:
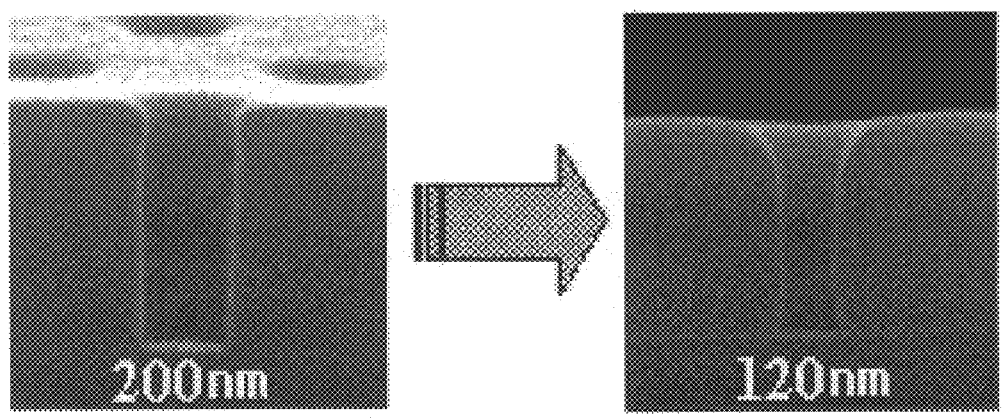
FIG. 1b shows a photoresist pattern obtained after a resist flow process using a conventional photoresist composition (thickness: 0.711 $\mu$m).
Figure 2A:
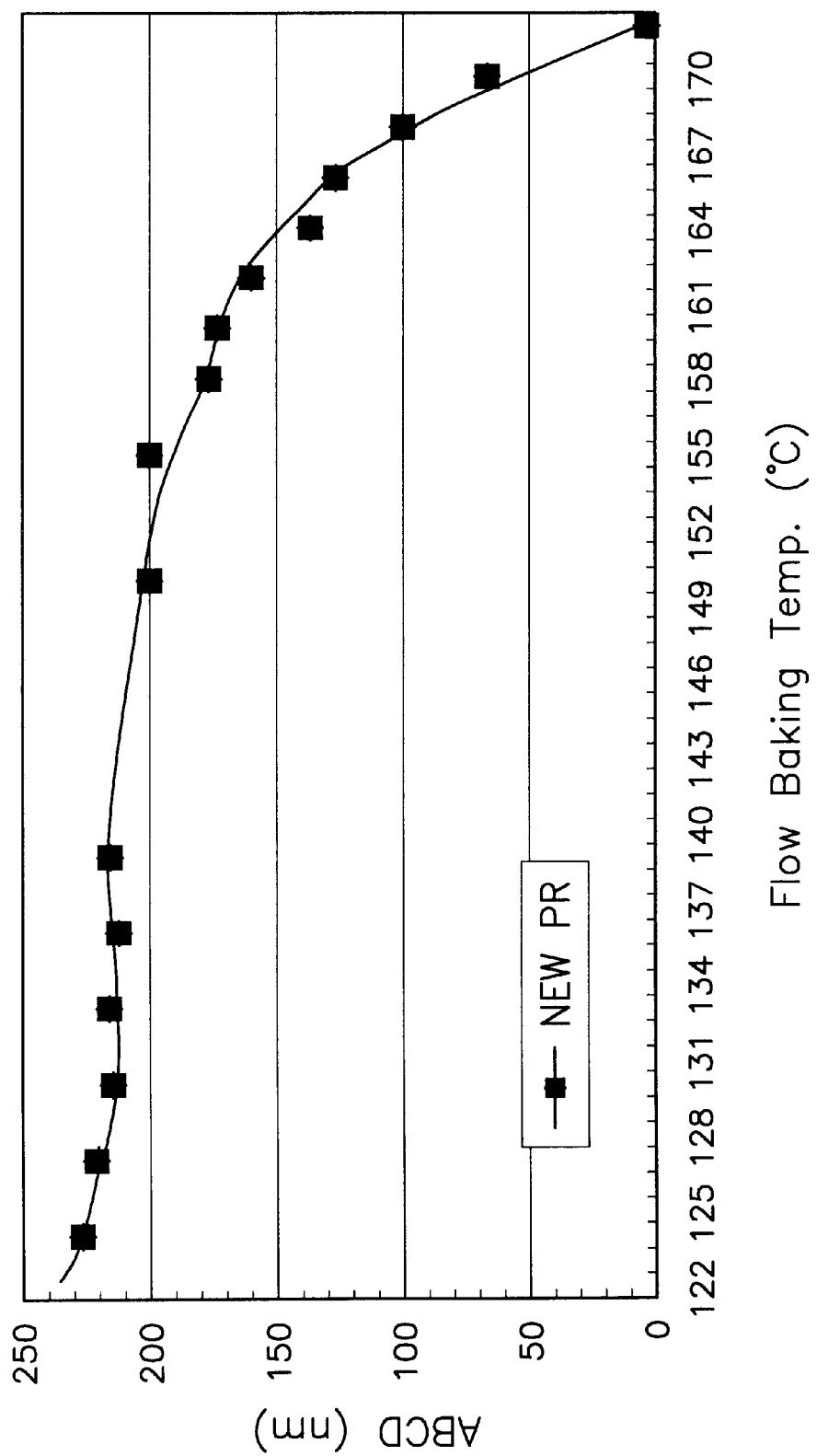
FIG. 2a is a graph of ABCD versus temperature of a resist flow process using a photoresist composition of the present invention.
Figure 2B:
FIGS. 2b to 2d show photoresist patterns obtained in Examples of the present invention.
Figure 2C:
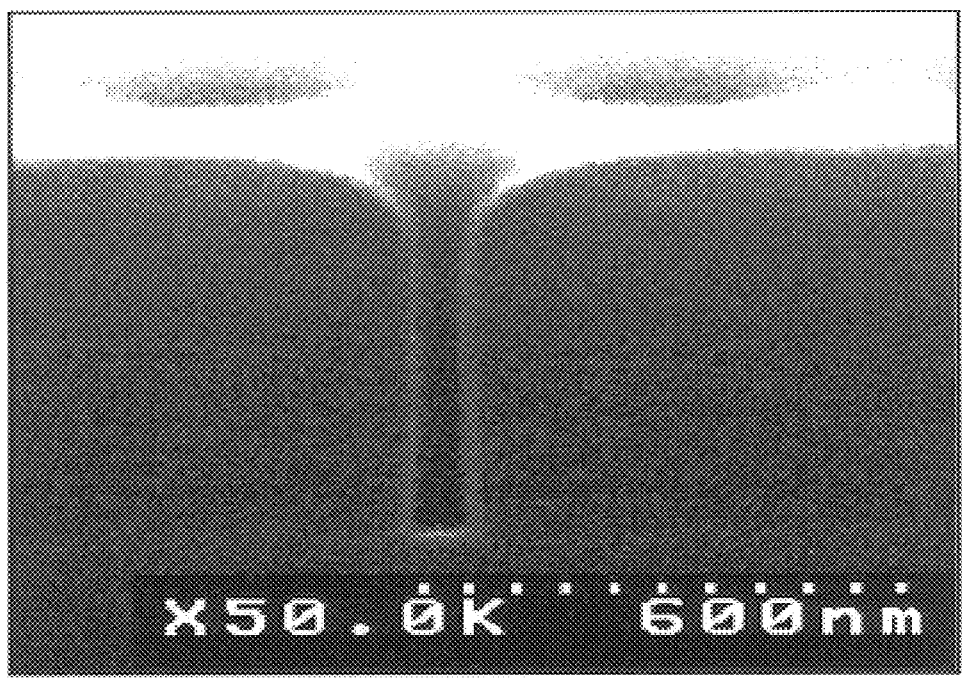
Figure 2D:
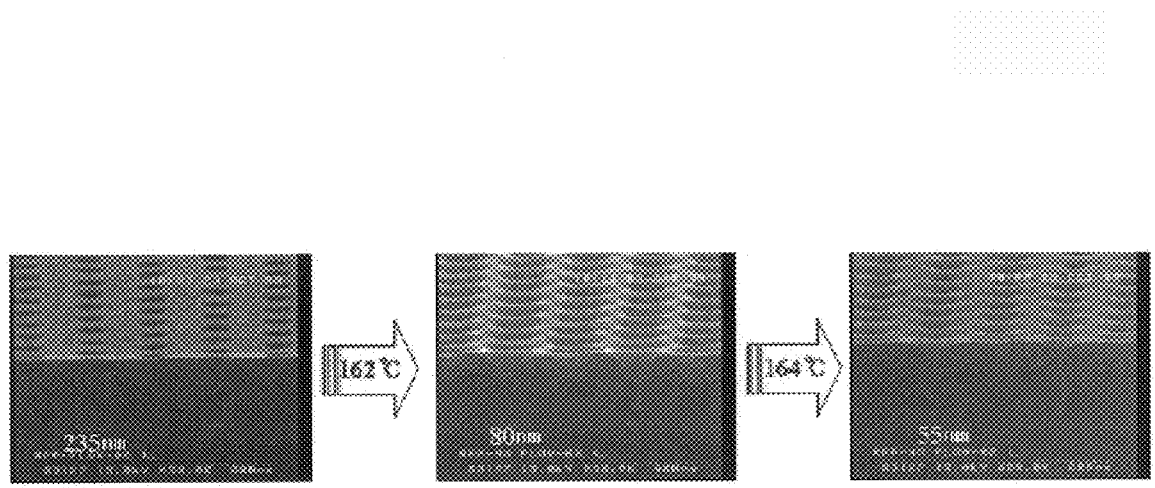

It is certified that error appears in the above-identified patent and that said Letters Patent is hereby corrected as shown below:

Column 2,
Lines 10-13, the paragraph "Fig. 1b shows a photoresist pattern obtained after a resist flow process using a conventional photoresist composition (thickness: 0.711µm)." should read -- FIG. 1b shows a photoresist pattern obtained after a resist flow process using a conventional photoresist composition (thickness: 0.7 µm). --

Column 10,
Lines 8-9, the paragraph "Synthesis of poly[4-hydroxystyrene/4-(1-ethoxy) ethoxy styrene/styrene/neopentvlglycoldiacrylate]" should read -- Synthesis of poly[4-hydroxystyrene/4-(1-ethoxy) ethoxy styrene/styrene/neopentylglycoldiacrylate] --.
Lines 32-33, the paragraph "Synthesis of poly[4-hydroxystyrene/4-(1-benzyloxy) ethoxy styrene/strene]" should read -- Synthesis of poly[4-hydroxystyrene/4-(1-benzyloxy) ethoxy styrene/styrene] --.
Lines 44-45, the paragraph "Synthesis of poly(4-hydroxystyrene/tert-butyl acrylate/strene/neopentylglycoldiacrylate)" should read -- Synthesis of poly (4-hydroxystyrene/tert-butyl acrylate/styrene/neopentylglycoldiacrylate) --.

Column 16,
Lines 1-2, the phrase "each R' is optionally substituted linear or branched $(C_1-C_{10})$alkylene; y is 1 or 2;" should read -- each R' is optionally substituted linear or branched $(C_0-C_{10})$alkylene; y is 1 or 2; --.
Lines 51-53, the phrase "each R is independently an optionally substituted linear or branched $(C_1-C_{10})$ alkylene;"

UNITED STATES PATENT AND TRADEMARK OFFICE
CERTIFICATE OF CORRECTION

PATENT NO. : 6,537,724 B1
DATED : March 25, 2003
INVENTOR(S) : Geun Su Lee et al.

It is certified that error appears in the above-identified patent and that said Letters Patent is hereby corrected as shown below:

Column 18,
Lines 50-51, the phrase "R and R' are independently an optionally substituted linear or branched ($C_1$-$C_{10}$) alkylene; and" should read -- R and R' are independently optionally substituted linear or branched ($C_0$-$C_{10}$) alkylene; and --.

Signed and Sealed this

Seventeenth Day of February, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,537,724 B1
DATED : March 25, 2003
INVENTOR(S) : Geun Su Lee et al.

It is certified that error appears in the above-identified patent and that said Letters Patent is hereby corrected as shown below:

Column 2,
Lines 10-13, the paragraph "Fig. 1b shows a photoresist pattern obtained after a resist flow process using a conventional photoresist composition (thickness: 0.711μm)." should read -- FIG. 1b shows a photoresist pattern obtained after a resist flow process using a conventional photoresist composition (thickness: 0.7 μm). --

Column 10,
Lines 8-9, the paragraph "Synthesis of poly[4-hydroxystyrene/4-(1-ethoxy) ethoxy styrene/styrene/neopentvlglycoldiacrylate]" should read -- Synthesis of poly[4-hydroxystyrene/4-(1-ethoxy) ethoxy styrene/styrene/neopentylglycoldiacrylate] --.
Lines 32-33, the paragraph "Synthesis of poly[4-hydroxystyrene/4-(1-benzyloxy) ethoxy styrene/strene]" should read -- Synthesis of poly[4-hydroxystyrene/4-(1-benzyloxy) ethoxy styrene/styrene] --.
Lines 44-45, the paragraph "Synthesis of poly(4-hydroxystyrene/tert-butyl acrylate/strene/neopentylglycoldiacrylate)" should read -- Synthesis of poly (4-hydroxystyrene/tert-butyl acrylate/styrene/neopentylglycoldiacrylate) --.

Column 16,
Lines 1-2, the phrase "each R' is optionally substituted linear or branched $(C_1-C_{10})$alkylene; y is 1 or 2;" should read -- each R' is optionally substituted linear or branched $(C_0-C_{10})$alkylene; y is 1 or 2; --.
Lines 51-53, the phrase "each R is independently an optionally substituted linear or branched $(C_1-C_{10})$ alkylene;" should read -- each R is independently an optionally substituted linear or branched $(C_0-C_{10})$ alkylene; --

UNITED STATES PATENT AND TRADEMARK OFFICE
CERTIFICATE OF CORRECTION

PATENT NO.    : 6,537,724 B1
DATED         : March 25, 2003
INVENTOR(S)   : Geun Su Lee et al.

It is certified that error appears in the above-identified patent and that said Letters Patent is hereby corrected as shown below:

<u>Column 18,</u>
Lines 50-51, the phrase "R and R' are independently an optionally substituted linear or branched ($C_1$-$C_{10}$) alkylene; and" should read -- R and R' are independently optionally substituted linear or branched ($C_0$-$C_{10}$) alkylene; and --.

This certificate supersedes Certificate of Correction issued February 17, 2004.

Signed and Sealed this

Twenty-seventh Day of April, 2004

JON W. DUDAS
*Acting Director of the United States Patent and Trademark Office*